US009378846B2

(12) United States Patent
Han

(10) Patent No.: US 9,378,846 B2
(45) Date of Patent: Jun. 28, 2016

(54) NON-MOUNTED STORAGE TEST DEVICE BASED ON FPGA

(71) Applicant: UNITEST INC., Gyeonggi-do (KR)

(72) Inventor: Young Myoun Han, Gangwon-do (KR)

(73) Assignee: UNITEST INC., Yongin-si, Gyeonggi-do (KR)

( * ) Notice: Subject to any disclaimer, the term of this patent is extended or adjusted under 35 U.S.C. 154(b) by 89 days.

(21) Appl. No.: 14/453,652

(22) Filed: Aug. 7, 2014

(65) Prior Publication Data
US 2015/0095712 A1 Apr. 2, 2015

(30) Foreign Application Priority Data
Sep. 30, 2013 (KR) .......................... 10-2013-0116039

(51) Int. Cl.
G11C 29/56 (2006.01)
G11C 29/12 (2006.01)
G06F 11/273 (2006.01)
G11C 16/00 (2006.01)

(52) U.S. Cl.
CPC .......... *G11C 29/1201* (2013.01); *G06F 11/273* (2013.01); *G11C 29/56004* (2013.01); *G11C 16/00* (2013.01)

(58) Field of Classification Search
CPC ....................................................... G11C 29/56
USPC .......................... 714/718, 726, 736, 742, 704
See application file for complete search history.

(56) References Cited
U.S. PATENT DOCUMENTS 6,708,319 B2 * 3/2004 Adachi .......... G01R 31/318511
700/110
7,559,003 B2 * 7/2009 Takahashi ............... G11C 29/56
714/736

FOREIGN PATENT DOCUMENTS

| KR | 10-0914174 B1 | 8/2009 |
| KR | 10-2010-0114697 A | 10/2010 |
| KR | 10-1254647 B1 | 4/2013 |
| KR | 10-2013-0084611 A | 7/2013 |
| WO | WO 2011/150409 A2 | 12/2011 |

OTHER PUBLICATIONS

Korean Office Action dated Jan. 15, 2015.

* cited by examiner

Primary Examiner — Fritz Alphonse
(74) Attorney, Agent, or Firm — Rabin & Berdo, P.C.

(57) ABSTRACT

A non-mounted storage test device based on FPGA includes a processor unit for performing enumeration and configuration for device, creating a scenario for test and performing test; a device driver unit for managing storage device; a data engine unit for generating pattern data for test and performing test; a system memory interface unit for receiving data for test and storing test result; a monitoring unit for monitoring packet; a DMA driver/address translation unit for performing DMA operation and transmitting Memory Read Request to Root Complex; a message input/output unit for transmitting to the data engine unit and the device driver unit; a switch unit for constituting DUT unit; a storage-in DUT unit as device under test which is storage for direct interface to PCIe including HBA; and a memory unit for storing data for test and record generated between tasks.

8 Claims, 5 Drawing Sheets

NON-MOUNTED STORAGE TEST DEVICE BASED ON FPGA

BACKGROUND OF THE INVENTION

1. Field of the Invention

The present invention relates to a driver mechanism for managing SSD test device based on PCIe (PCI Express), in particular, to a non-mounted storage test device based on FPGA, but not based on PC.

2. Description of the Related Art

Currently, SSD (Solid State Drive) is spotlighted as HSS (High Speed Storage). Since SSD based on PCI express has capacity of mass traffic management capability compared to SAS SATA, its market is extended to the market of personal SSD market as well as enterprise server such as data center.

Meanwhile, there are prior art related to a device for testing storage filed or disclosed such as Korean patent publication No. 10-2010-0114697 (hereinafter, "cited reference"), and etc.

The cited reference comprises a storage interface unit for managing interface with a storage; a user interface unit for receiving test condition for testing the storage from user; a test pattern generation unit for generating test pattern for testing the storage corresponding to the test condition received from the user; and a test control unit for controlling the storage test by the test pattern.

However the conventional devices including the cited reference, perform data writing of specific pattern in SSD device and read back and compare those to check if the data are valid in order to detect fail LBA (Logic Block Address) of flash array. This device stores data in buffer (expected data buffer) which are generated by pattern data generator and data generator. Failure is determined by reading the stored data from SSD device and comparing those with contents in the data buffer. This method has a limitation problem of available buffer capacity.

Currently the capacity of SSD reaches up to hundreds of gigabytes. In order to test this device, various limitations are caused by increasing the size of expected value buffer. For example, with too small buffer, dataRead/Write is performed with small data block, which increases testing time. With too large buffer, it brings better performance but requests the size of memory which cannot be accommodated in terms of the system.

Also, compared to mounted bases in test environment, time for response and test is increased in command process of test device driver.

SUMMARY OF THE INVENTION

The present invention relates to a driver mechanism for managing SSD test device based on PCI-Express (PCIe), in particular, to a non-mounted type of storage tester device hardware driver mechanism based on FPGA, but not based on PC.

Specifically, unlike a mounted system, since all resources in the system are configured as hardware for the purpose of SSD management, compared to mounted basis test environment, response shall be faster and testing time shall be shortened. The present invention also provides a tester for testing a large amount of SSD rapidly.

In order to achieve this technical matter, the present invention relates to a non-mounted storage test device based on FPGA, and comprises a processor unit configured as microprocessor (EPU) inside FPGA for performing enumeration and configuration for device of PCIe bus tree below RC (Root Complex), setting a device driver unit by creating a scenario for test, and performing test; the device driver unit as block generating ATA (Advanced Technology Attachment) command used in a storage device based on the test scenario created by the processor for communicating with HBA (Host Bridge Adapter) including AHCI (Advanced Host Controller Interface) managing storage device; a data engine unit for generating pattern data to be used for test, and performing test by accessing to data stored by user from system memory; a system memory interface unit for receiving data needed to proceed test by accessing to the processor unit and the data engine unit and storing test result; a monitoring unit for monitoring packet of PCIe transaction layer and storing this in case of occurrence of test failure; a DMA driver/address translation unit for performing DMA operation that all stream of data becomes HBA Master, and transmitting Memory Read Request to Root Complex including the device driver unit when the device driver decodes the scenario and transmits commands to HBA; a message input/output unit for transmitting to the data engine unit and the device driver unit in case TLP to Bus ConRC is message as reading result of the DMA driver/address translation unit; a PCIe IP unit as SW IP of PCI Express logic; a switch unit for constituting DUT unit by connecting to the PCIe IP unit; a storage-in DUT unit as device under test which is storage having direct interface to PCIe by including HBA; and a memory unit for storing data to be used in test and record generated between tasks.

Also when the test is complete, the processor unit receives the result for occurrence of an error or success from the device driver, and accesses to error information of device and TLP of PCIe in case of occurrence of an error.

Also, commands of the device driver unit is characterized by including base address and size of Data Buffer for Read/Write, and LBA (Logic Block Address) information of SSD.

Also, information to be written in the scenario is characterized by including at least one of following information among information needed for test order including performing time of the whole test scenario, LBA MODE (sequential mode or random access mode), Data pattern, and Command Queued Depth, and information needed to write command for ATA command for PCIe storage (SSD) based on AHCI (Advanced Host Controller Interface) and PCI storage (SSID) based on SCSI (Small Computer System Interface).

Also, the data engine unit comprises a pattern data generation module for generating data needed for writing in SSD, and generating Expected Data during the operation of Read & compare; a comparison module for determining if data of corresponding LBA are identical by comparing Expected data generated through the pattern data generation module and data read from SSD, i.e. data of HBA Mwr (Memory Write Request) during the operation of Read & compare; a failure record storing module for storing failure information in case the data are not identical from the result of the comparison module; and a system memory input module for receiving data which user stored from the system memory interface.

Also the DMA driver/address translation unit is characterized by receiving information about Request transmitted to Root Complex by EP (HBA Endpoint), and transmitting those to the device driver unit and the data engine unit.

Also, the DMA driver/address translation unit, in case the device driver unit transmits Mwr (Memory Write Request) packet transmission flag in order to access to HBA register, decodes this flag in order that Root Complex completes writing in register of HBA.

In case the HBA transmits Mrd (Memory Read Request) packet to Root Complex in order to request Command Header information, the packet is connected to the device driver unit, read and connected in order to transmit the corresponding information to Cpld (Completion with Data) packet from the device driver unit.

And the switch unit is characterized by increasing the number of PARA using a plurality of switches in case of configuring inside Bandwidth of Root Complex.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF SPECIFIC EMBODIMENTS

Hereinafter, a detailed description will be given of the present invention.

The non-mounted storage test device based on FPGA is described as the following with reference to FIGS. 1 to 5.

Figure 1:
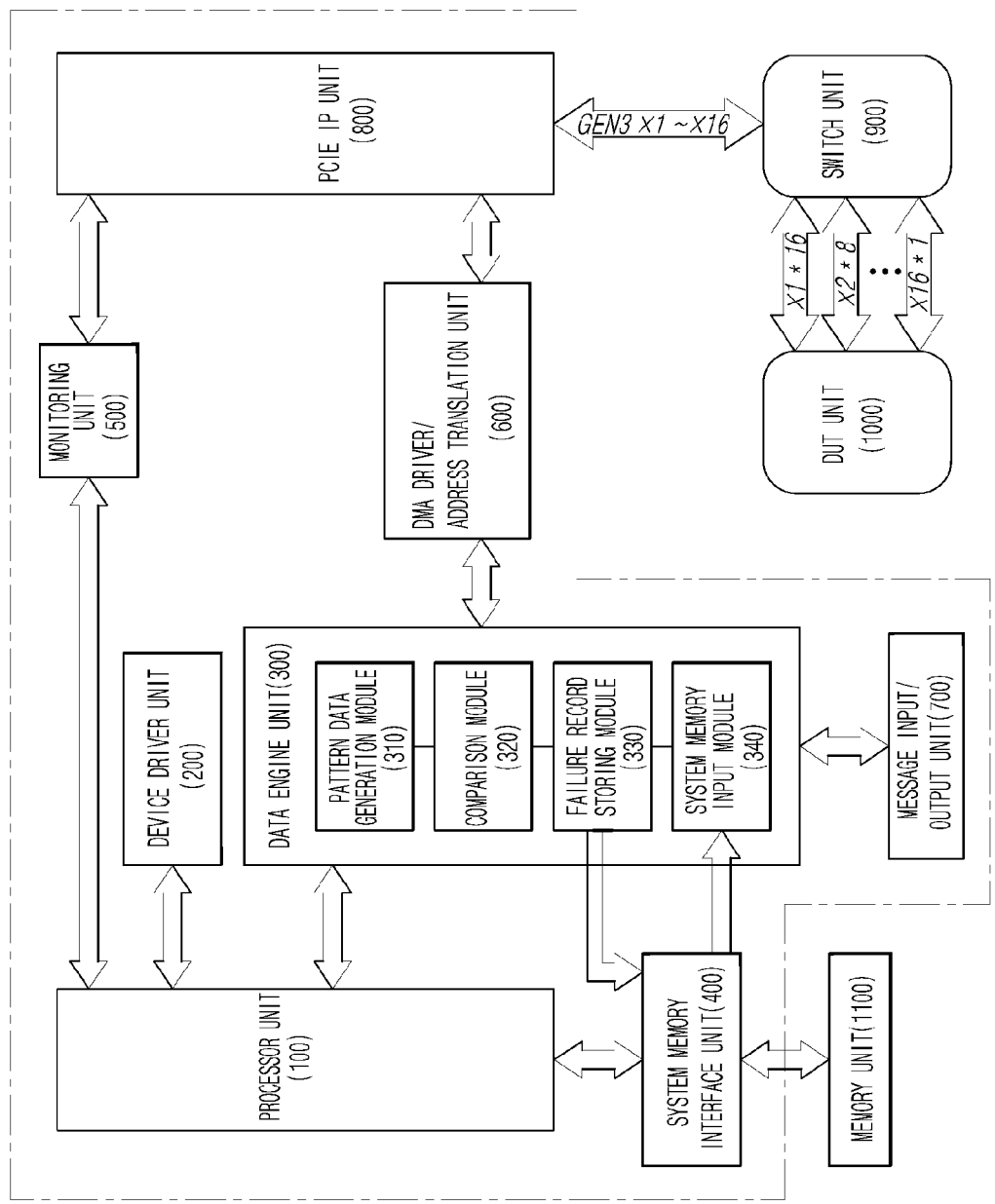
FIG. 1 is an overall configuration diagram conceptually illustrating non-mounted storage test device based on FPGA according to the present invention.

FIG. 1 is an overall configuration diagram conceptually illustrating non-mounted storage test device based on FPGA according to the present invention comprising a processor unit 100, a device driver unit 200, a data engine unit 300, a system memory interface unit 400, a monitoring unit 500, a DMA driver/address translation unit 600, a message input/output unit 700, a PCIe IP unit 800, a switch unit 900, a DUT unit 1000, a memory unit 1100 as shown.

The processor unit 100 is a microprocessor (Embedded Processor Unit: EPU) configured inside FPGA, for performing enumeration and configuration for device of PCIe bus tree below RC (Root Complex), setting the device driver unit 200 by creating a scenario for test, and performing test.

In case test is complete, the result about occurrence of an error and success is received from the device driver unit 200.

In case of occurrence of an error, error information of device and TLP of PCIe can be accessed.

The device driver unit 200 is a block generating ATA (Advanced Technology Attachment) command used in storage device based on the test scenario created by the processor unit 100 for communicating with HBA (Host Bridge Adapter) such as AHCI (Advanced Host Controller Interface) managing storage device.

Those commands include base address and size of Data Buffer for Read/Write, and LBA (Logic Block Address) information of SSD. Based on the information, HBA performs DMA (Direct Memory Access: DMA) behavior on order to read or write on storage device (SSD).

Figure 2:
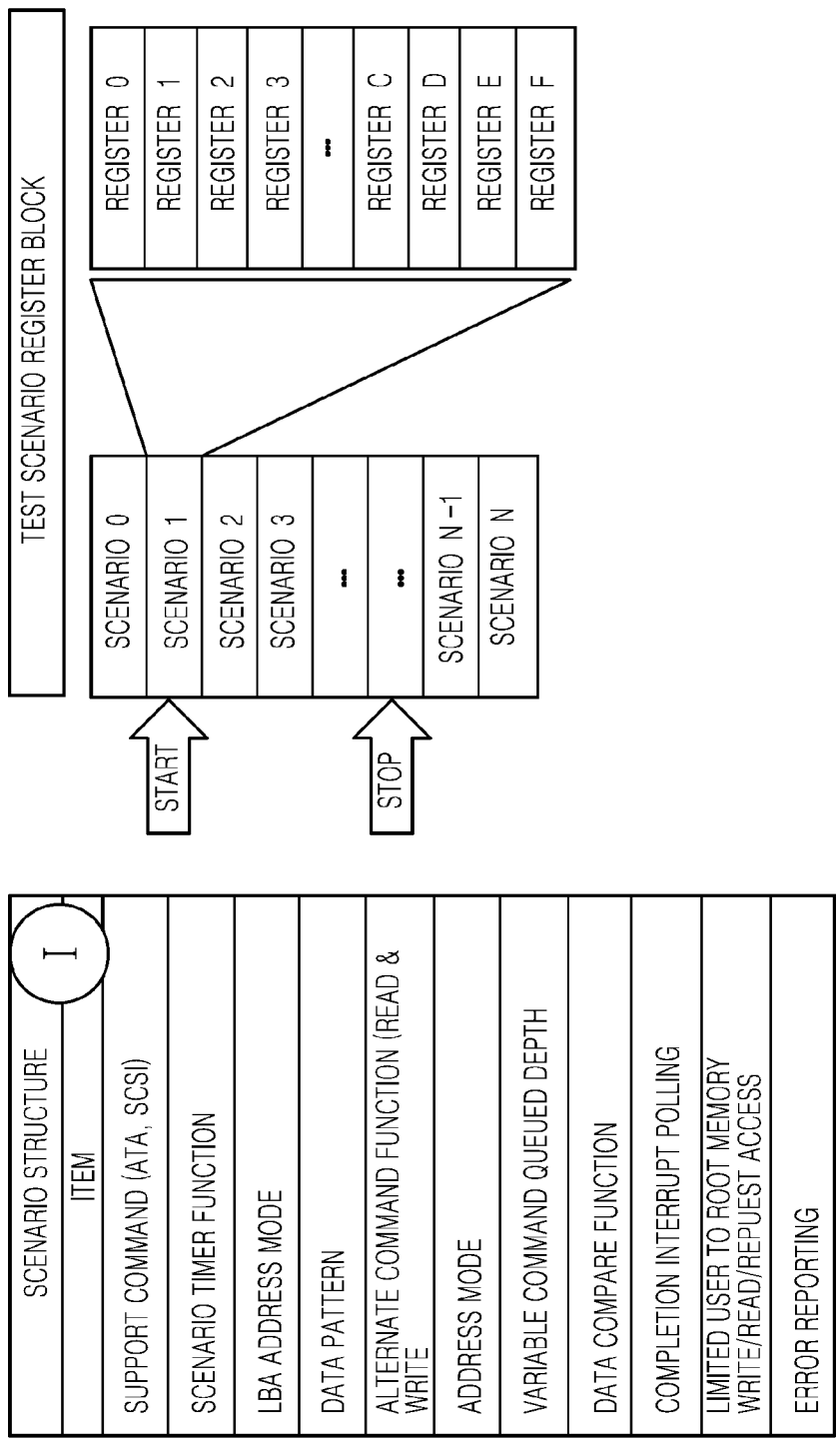
FIG. 2 is a diagram of an exemplary embodiment showing scenario information created by the processor unit according to the present invention.

(I) of FIG. 2 is information of a scenario created by the processor unit 100, and one scenario is made of N DW registers. These scenario slots of 0~N exist, and there are Start point and Stop point.

The information to be written in the scenario (in reference to FIG. 2 (I)) is characterized by including information needed for test order such as performing time of the whole test scenario, LBA MODE (sequential mode or random access mode), Data pattern, and Command Queued Depth, etc., and information needed to write command for ATA command for PCIe storage (SSD) based on AHCI (Advanced Host Controller Interface) and command for PCI storage (SSID) based on SCSI (Small Computer System Interface).

The data engine unit 300 generates pattern data to be used for test, and performs test by accessing to data stored by user from system memory, as shown in FIG. 1, and comprises a pattern data generation module 310, a comparison module 320, a failure record storing module 330, and a system memory input module 340.

Specifically, the pattern data generation module 310 generates data needed to be written in SSD, and generates Expected Data during operation of Read & compare.

At this time, the pattern data generation module 310 generates random data with Seed value made by using memory address requested to the LBA and DMA driver/address translation unit 600.

More specifically, the pattern data generation module 310 generates data needed for writing in SSD, and generates Expected Data during the operation of Read & compare. Also, Mrd request is received to DMA driver/address translation unit 600.

The amount of requested data is accumulated in this packet. When the amount is accumulated as much as 1-Sector, seed shall be generated by combining the requested address and the LBA of command to reset logic.

At this time, if corresponding LBA is identical to Seed Factor, random data generated with the same Seed value are stored. Thus, same data are stored regardless of random, sequential LBA.

Accordingly, additional memory for storing expected data is not necessary. Herein, Seed Factor is a variable to prevent the same pattern data from being stored in LBA all the time by adding to basic Seed value.

The comparison module 320, during the operation of Read & compare, determines if data of corresponding LBA are identical by comparing Expected data generated through the pattern data generation module 310 and data read from SSD, i.e. data of HBA Mwr (Memory Write Request) during the operation of Read & compare and failure information is stored in failure record storing module 330 in case the data of corresponding LBA are not identical, that is, the failure record storing module 330 stores read data, Expected data, and LBA in which failure occurs. The system memory input module 340 receives data which user stores from the system memory interface unit 400.

The system memory interface unit 400 receives data needed for the processor unit 100 and the data engine unit 300 in order to proceed with test by accessing to the memory unit 1100, and stores the test result.

Figure 3:
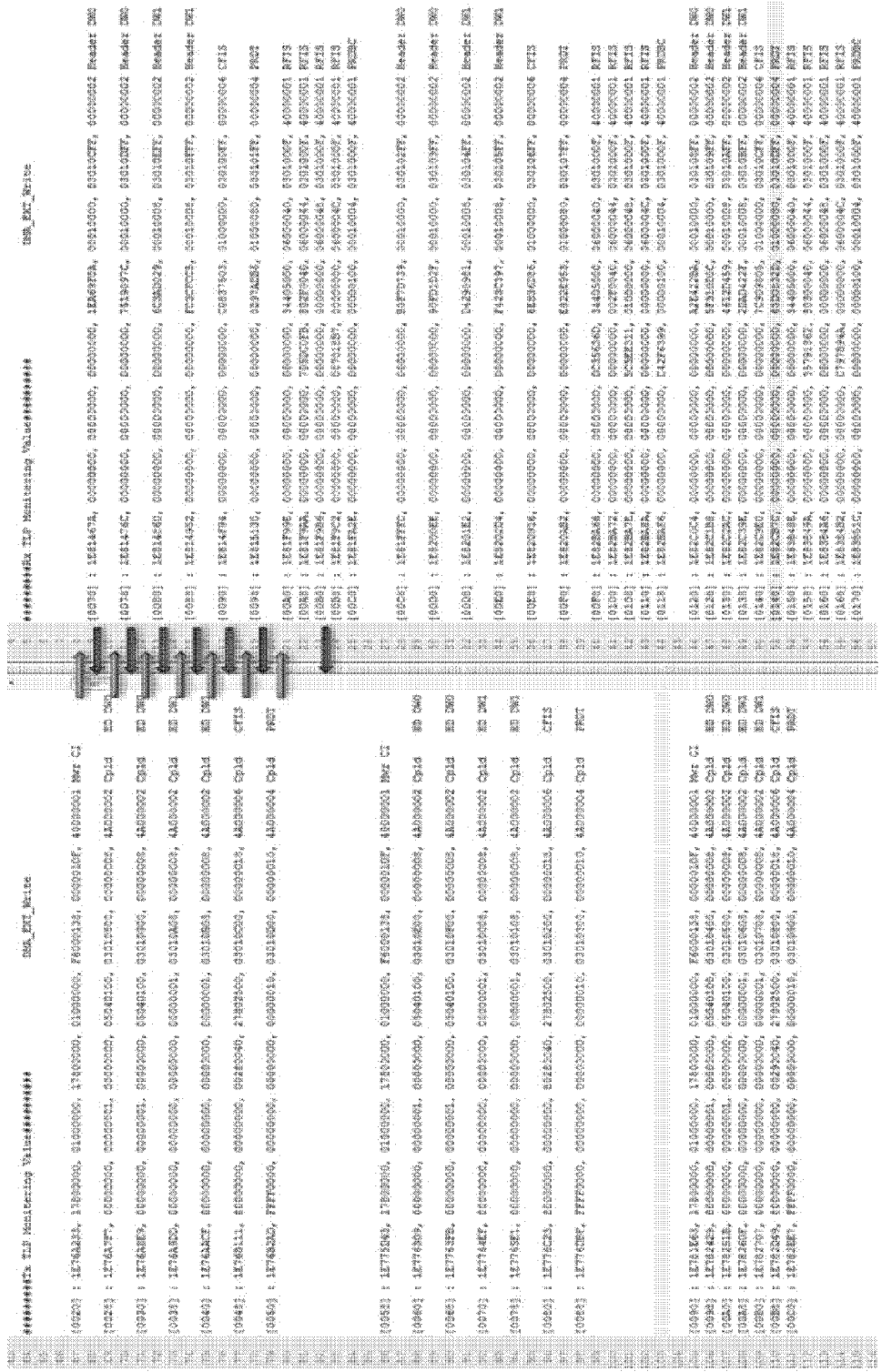
FIG. 3 is a diagram of an exemplary embodiment showing log accessing to packet log of transaction layer in the processor unit according to the present invention.

The monitoring unit 500 monitors packets of PCIe transaction layer and stores those in case of occurrence of test failure, and can be accessed by the processor unit 100. FIG. 3 is a diagram of an exemplary embodiment showing log for accessing packet log of transaction layer in the processor unit 100.

The DMA driver/address translation unit 600 performs DMA operation that data stream becomes HBA Master, and transmits Memory Read Request to Root Complex including the device driver unit 200 when the device driver unit 200 decodes the scenario and transmits commands to HBA through PCIe Bus. At this time, the data engine unit 300 transmits data for address requested by HBA.

Also, the DMA driver/address translation unit 600 receives information about Request transmitted to Root Complex by HBA EP (Endpoint), and transmits to the device driver unit 200 and the data engine unit 300.

For example, when the device driver unit 300 transmits Mwr (Memory Write Request) packet transmission flag for the device driver unit 300 to access to register of HBA, this flag is decoded so that Root Complex can complete writing in the register of HBA.

Then, in case HBA transmits Mrd (Memory Read Request) packet to Root Complex for requesting Command Header information, this packet is connected to the device driver unit 200, read and connected in order to transmit the corresponding information to Cpld (Completion with Data) packet from the device driver unit 200.

In case TLP coming up to Bus ConRC is message as reading result of the DMA driver/address translation unit 600, the message input/output unit 700 transmits to the data engine unit 300 and the device driver unit 200.

The PCIe IP unit 800 is a SW IP of PCI Express logic.

The switch unit 900 is connected to the PCIe IP unit 800, and constitutes the DUP unit 1000.

Figure 4:
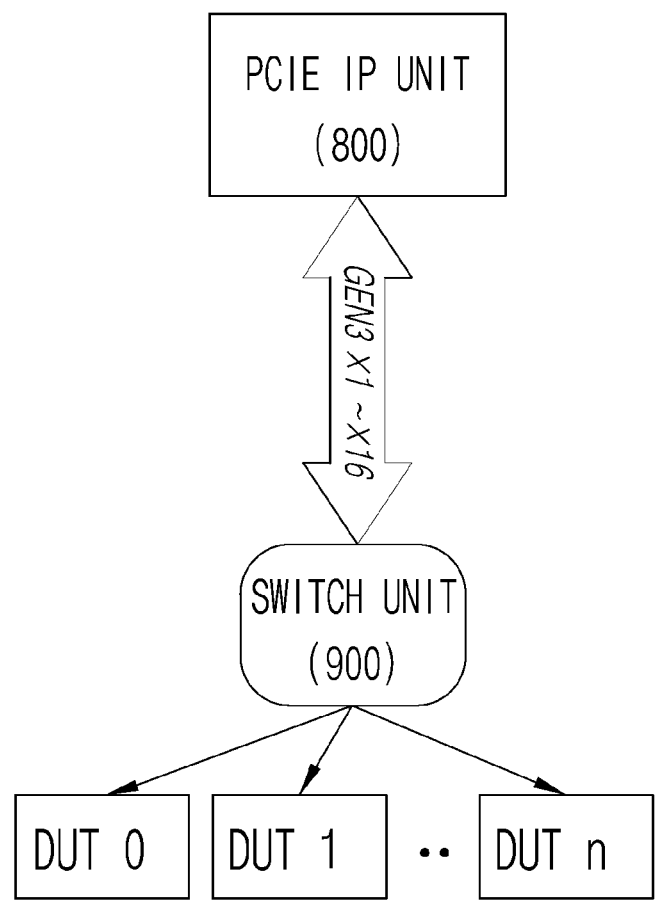
FIG. 4 is a diagram of an exemplary embodiment showing connection with DUT unit using the switch unit according to the present invention.
Figure 5:
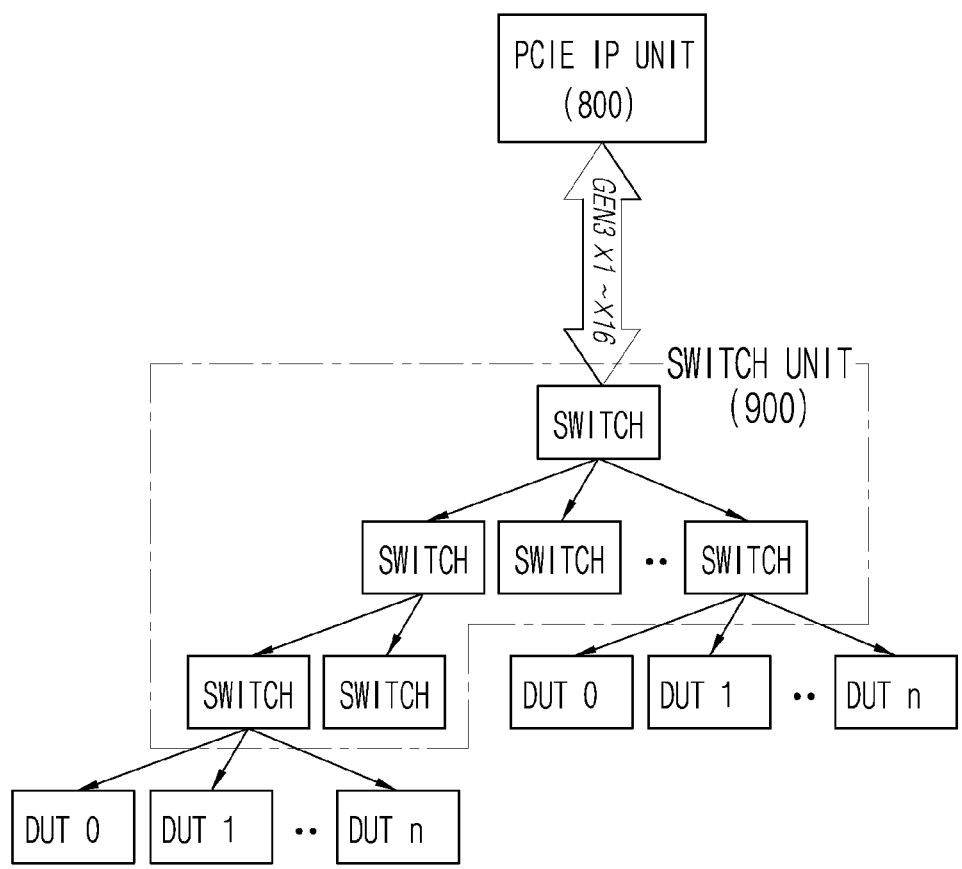
FIG. 5 is a diagram of an exemplary embodiment showing how PARA is increased by using a plurality of switches according to the present invention.

FIG. 4 is a diagram of an exemplary embodiment showing connection with the DUT unit using the switch according to the present invention, and FIG. 5 is a diagram of an exemplary embodiment showing how PARA is increased by using a plurality of switches.

Herein, in case it is configured within Bandwidth of Root Complex (with reference to FIG. 4), it can be configured so that PARA (the number of storages testable at once) can be increased by using a plurality of switches (with reference to FIG. 5).

The DUT unit 1000 is, as device under test, storage including HBA and directly interfacing to PCIe.

The memory unit 1100 stores data to be used for test, and record generated between tasks.

Meanwhile, test procedure using the test device as aforementioned is described briefly as follows.

First, the processor unit 100 performs enumeration and configuration for device of PCIe bus tree, sets the device driver unit by creating a scenario for test, and performs test. When test is complete, it is received whether an error occurs or not. In case of occurrence of an error, error information of device is stored. In case the error does not occur, test performance complete information is stored.

As described above, the present invention is not limited by the embodiments and the accompanying drawings. Possible for a large number of changes and modifications to the category of the technical idea disclosed in the present invention without departing from the present invention to those skilled in the art will be able to understand better. Appropriate, all such changes and modifications and equivalents as fall within the scope of the invention, therefore, can be considered. Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A non-mounted storage test device based on FPGA (Field-Programmable Gate Array), comprising:
    a processor unit configured, as a microprocessor embedded inside FPGA, for performing enumeration and configuration for device of PCIe (Peripheral Component Interconnect Express) bus tree below RC (Root Complex), setting the device driver unit by creating a scenario for test, and performing test;
    a device driver unit, as block generating ATA (Advanced Technology Attachment) command used in storage device based on the test scenario created by the processor unit, for communicating with HBA (Host Bridge Adapter) including AHCI (Advanced Host Controller Interface) managing storage device;
    a data engine unit for generating pattern data to be used for test, and performing test by accessing to data stored by user from system memory;
    a system memory interface unit for receiving data needed to proceed test by accessing to the memory by the processor unit and the data engine unit and storing test result;
    a monitoring unit for monitoring packet of PCIe transaction layer and storing this in case of occurrence of test failure;
    a DMA (Direct Memory Access) driver/address translation unit for performing DMA operation that all data stream become HBA Master, and transmitting Memory Read Request to Root Complex including the device driver unit when the device driver unit decodes the scenario and transmits commands to HBA through PCIe bus;
    a message input/output unit for transmitting to the data engine unit and the device driver unit in case TLP (Transaction Layer Packet) coming up to Bus PCIe RC (Root Complex) is message as reading result of the DMA driver/address translation unit;
    a PCIe SW IP (Software Intellectual Property) unit as SW IP of PCI Express logic;
    a switch unit for constituting DUT (Device Under Test) unit by connecting to the PCIe IP unit;
    a storage-in DUT unit as device under test which is storage for direct interface to PCIe including HBA; and
    a memory unit for storing data to be used in test and record generated between tasks.

2. The non-mounted storage test device based on FPGA of claim 1, wherein the processer unit, in case test is complete, receives the result for occurrence of an error or success from the device driver unit, and accesses to error information of device and TLP of PCIe in case of occurrence of an error.

3. The non-mounted storage test device based on FPGA of claim 1, wherein commands of the device driver unit include base address and size of Data Buffer for Read/Write, and LBA (Logic Block Address) information of SSD (Solid State Drive).

4. The non-mounted storage test device based on FPGA of claim 1, wherein information to be written in the scenario include at least either information needed for test order including performing time of the whole test scenario, LBA MODE (sequential mode or random access mode), Data pattern, and Command Queued Depth, or information needed to write command for ATA command for PCIe storage (SSD) based on AHCI (Advanced Host Controller Interface) and PCI storage (SSID) based on SCSI (Small Computer System Interface).

5. The non-mounted storage test device based on FPGA of claim 1, wherein the data engine unit comprises a pattern data generation module for generating data needed for writing in SSD, and generating Expected Data during the operation of Read & compare;
    a comparison module for determining if data of corresponding LBA are identical by comparing Expected data generated through the pattern data generation module and data read from SSD, i.e. data of HBA Mwr (Memory Write Request) during the operation of Read & compare;

a failure record storing module for storing failure information in case the data are not identical from the result of the comparison module; and a system memory input module for receiving data which user stored from the system memory interface unit.

6. The non-mounted storage test device based on FPGA of claim 1, wherein the DMA driver/address translation unit receives information about Request transmitted to Root Complex by HBA EP (EndPoint), and transmits those to the device driver unit and the data engine unit.

7. The non-mounted storage test device based on FPGA of claim 1, wherein the DMA driver/address translation unit, in case the device driver unit transmits Mwr (Memory Write Request) packet transmission flag in order to access to HBA register, decodes this flag in order that Root Complex completes writing in register of HBA, and in case the HBA transmits Mrd (Memory Read Request) packet to Root Complex in order to request Command Header information, the packet is connected to the device driver unit, read and connected in order to transmit the corresponding information to Cpld (Completion with Data) packet from the device driver unit.

8. The non-mounted storage test device based on FPGA of claim 1, wherein the switch unit increases the number of PARA (Parallel) using a plurality of switches in case of configuring within Bandwidth of Root Complex.

* * * * *